United States Patent [19]

Finney et al.

[11] Patent Number: 5,440,164
[45] Date of Patent: Aug. 8, 1995

[54] MOS/BIPOLAR DEVICE

[75] Inventors: Adrian D. Finney, Oldham; David N. Casey, Ramsbottom, both of United Kingdom

[73] Assignee: Zetek plc, Oldham, United Kingdom

[21] Appl. No.: 223,761

[22] Filed: Apr. 6, 1994

[30] Foreign Application Priority Data

Oct. 22, 1993 [GB] United Kingdom ............ 9321819

[51] Int. Cl.6 .................. H01L 27/02; H01L 29/78
[52] U.S. Cl. .................................. 257/378; 257/327; 257/329; 257/488; 257/655
[58] Field of Search ............ 257/378, 327, 329, 488, 257/655

[56] References Cited

U.S. PATENT DOCUMENTS

| | | | |
|---|---|---|---|
| 5,101,257 | 3/1992 | Hayden et al. | 257/378 |
| 5,245,202 | 9/1993 | Yasukazu | 257/378 |
| 5,247,200 | 9/1993 | Momose et al. | 257/378 |

Primary Examiner—Mark V. Prenty
Attorney, Agent, or Firm—Jacobson, Price, Holman & Stern

[57] ABSTRACT

An integrated device is provided which has a bipolar transistor as an output stage. The bipolar transistor is driven by a short channel metal oxide semiconductor field effect transistor. Such a device has a low on state voltage drop substantially irrespective of the potential supported by the device.

17 Claims, 6 Drawing Sheets

MOS/BIPOLAR DEVICE

The present invention relates to a metal-oxide semiconductor (MOS)/bipolar semiconductor device.

It is known that bipolar transistors exhibit a low forward voltage drop (Vce) when driven into saturation. However, a bipolar transistor requires a relatively large amount of power to drive the device. Metal-oxide semiconductor field effect transistor (MOSFET) devices require little power to drive them, but exhibit relatively large voltage drops while turned on. An insulated gate bipolar transistor (IGBT) combines both a low on state voltage and a low drive requirement, but only if the IGBT supports more than 1 volt or so across the device.

According to the present invention, there is provided a monolithically integrated semiconductor device, comprising a bipolar transistor output stage having a base region and a collector region, and at least one short channel metal oxide semiconductor field effect transistor for controlling current flow in the base region, the at least one short channel metal oxide semiconductor field effect transistor being separate from the collector region.

It is thus possible to provide a high power semiconductor device which has a low on state voltage drop and a low drive requirement substantially irrespective of the potential supported by the device.

Figure 1A:
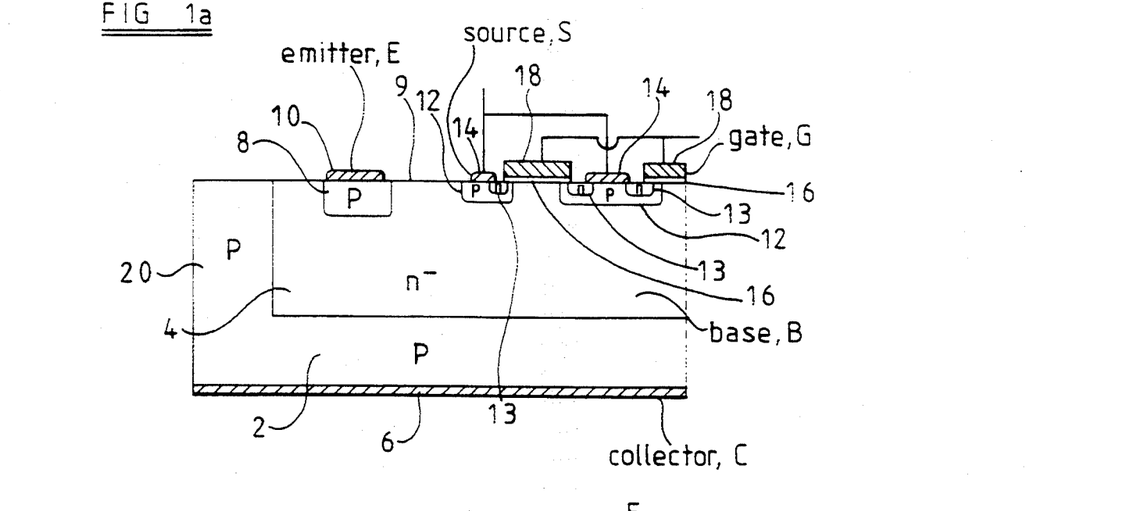
FIG. 1a is a schematic representation of a device constituting a first embodiment of the present invention and having a vertical MOSFET.

The term "short channel" is well know in the art, however, by way of explanation, it generally refers to a device structure where the regions 12 and 13 shown in FIG. 1a of the accompanying drawings are defined at or close to the edge of the gate G. The difference in the lateral extent of the regions 12 and 13 defines a surface channel region.

Preferably the bipolar transistor is a vertically formed transistor.

Preferably the or each metal-oxide semiconductor field effect transistor (MOSFET) is integrally formed with the base region of the bipolar transistor. Preferably the or each MOSFET has a short channel vertical or lateral double diffused metal oxide silicon (DMOS) structure. Advantageously the or each MOSFET operates in an enhancement mode, such that the device inhibits current flow in the base region of the bipolar transistor when the potential at a gate terminal of the MOSFET is less than a threshold voltage measured with respect to a source terminal of the MOSFET.

Preferably the bipolar transistor comprises a first terminal connected to a substrate of a first semiconductor, an epitaxial layer of a second semiconductor formed on the substrate, and a first region of the first semiconductor formed within the epitaxial layer and connected to a second terminal.

Preferably the MOSFET comprises a second region of the first semiconductor formed within the epitaxial layer and a third region of the second semiconductor formed within the second region, a third terminal connected to the second and third regions and a gate terminal formed adjacent sections of the second and third regions but substantially insulated therefrom and from the third terminal.

When the first semiconductor is a P type semiconductor and the second semiconductor is an N type semiconductor, the first terminal may be a collector, the second terminal may be an emitter and the third terminal is a source. However, in an alternative construction, the first terminal may be an emitter and the second terminal may be a collector.

Advantageously a metallic conductor may extend from part of the epitaxial layer adjacent the second region to part of the epitaxial layer adjacent the first region or to regions of the second semiconductor formed within the first region, thereby distributing the base current around the first region.

Advantageously a region of semiconductor of the same type as the substrate extends, at the edges of a die on which the device is fabricated, from the substrate to the surface of the device. Thus the depletion region may be prevented from spreading to the edge of the die.

Advantageously the device is provided with at least one field plate. Additionally or alternatively rings of p type and/or n type semiconductor may be formed within the epitaxial layer, for example, by diffusion. Such rings are known as kao rings. The provision of kao rings and/or field plates increases the voltage that the device can withstand before breakdown occurs.

Advantageously the bipolar transistor may have a less doped collector region, for example a p$^-$ region, adjacent the collector-base interface and/or the base may have a region of increased doping adjacent the emitter region. It is thus possible to arrange for breakdown to occur in the bulk of the device before the depletion region across the collector-base junction reaches through to the emitter.

Preferably a heavily doped region of the same type of semiconductor as the epitaxial layer is formed at the substrate-epitaxial layer interface beneath the MOSFET. Such a region suppresses the operation of a vertical parasitic thyristor and reduces the operation of a vertical parasitic IGBT.

Advantageously lifetime killers, such as gold and irradiation damage, may be used to reduce the gain of a or each parasitic thyristor and a or each parasitic IGBT. Lifetime killers may also be used to increase the turn off speed of the device.

Advantageously anode shorts may be provided so as to increase the switching speed of the device without the need for lifetime killers. Both anode shorts and lifetime killers may be included within the same device.

The present invention will further be described, by way of example, with reference to the accompanying drawings, in which.

In the drawings, the vertical broken line represents a plane of device symmetry.

Figure 1B:
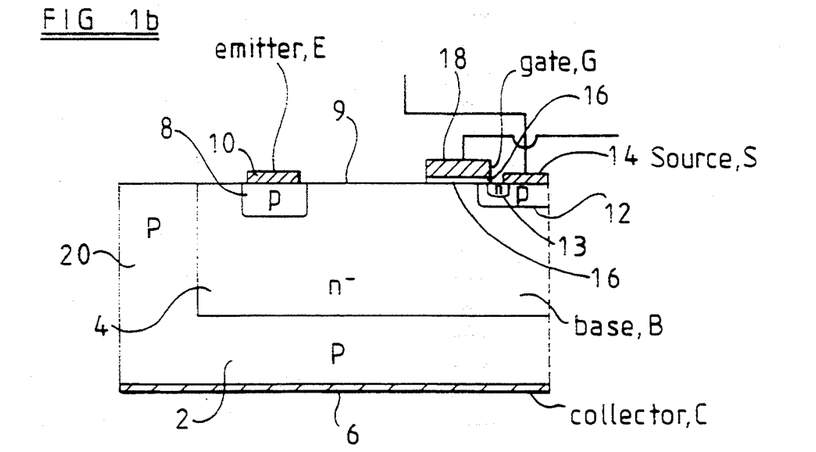
FIG. 1b is a schematic representation of a similar device having a lateral MOSFET in place of the vertical MOSFET.

FIG. 1a shows the structure of a device comprising a p type semiconductor substrate 2 having an n⁻ type epitaxial layer 4 formed thereon. The substrate 2 is connected, on a side thereof opposed to the epitaxial layer 4, to a first metallic conductor 6. A first p type region 8 is formed at a surface 9 of the epitaxial layer 4. The region 8 is in contact with a second metallic conductor 10. The p type substrate 2 forms a collector C, the epitaxial layer 4 forms a base region and the first p type region 8 forms an emitter E of a PNP transistor. The first and second metallic conductors 6 and 10 provide electrical connections to the collector C and the emitter E, respectively. Further p type regions 12 are formed at the surface 9 of the epitaxial layer 4. At least one n type region 13 is formed within each of the further p type regions 12. Third metallic conductors 14 are provided in contact with first parts of the further p regions 12 and first parts of the n type regions 13. Fourth conductors 18 are disposed adjacent second parts of the further p regions 12 and second parts of the n type regions 13, but are insulated therefrom by thin oxide layers 16. The p and n regions 12 and 13, together with the insulating layer 16 and the conductors 14 and 18 form an N channel vertical MOSFET which, in use, supplies base current to the PNP bipolar transistor. The third metallic conductors 14 act as the source terminals S of the MOSFET, whereas the fourth conductors 18 act as the gate contacts of the MOSFET. A similar arrangement is shown in FIG. 1b, where the positions of the source and gate have been changed so as to form a N channel lateral MOSFET. The fourth conductors can be metallic or be polysilicon.

The MOSFET is very efficient since it has a short channel DMOS structure. Such a structure provides a threshold voltage which is substantially independent of bias conditions. The bipolar transistor is also efficient since it has a vertical power structure.

Figure 2:
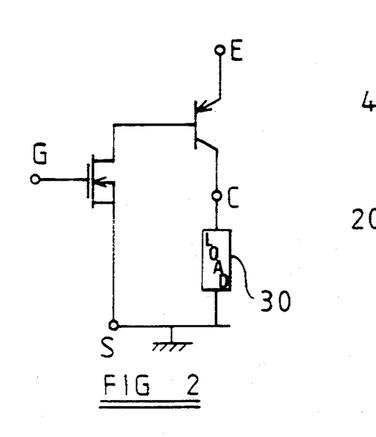
FIG. 2 is an equivalent circuit of the device shown in FIG. 1.

FIG. 2 is an equivalent circuit of the device illustrated in FIGS. 1a and 1b, including an external load 30 so as to illustrate a circuit incorporating the device.

The device can be used as a high side switch (i.e. connected between a load and a positive supply) which is driven like a conventional N channel enhancement mode MOSFET, that is, not conducting when $V_{GS}=0$ volts and conducting when $V_{GS}$ is greater than a threshold voltage of typically 1 to 2 volts.

The structure of the device may give rise to the formation of parasitic IGBTs. A vertical IGBT is formed from the MOS gate, n type region 13, the p type region 12, the n⁻ type epitaxial layer 4 and the p type substrate 2. A lateral IGBT is formed by the MOS gate, n type region 13, the p type region 12, the n⁻ type epitaxial layer 4 and the p type region 8. Like all IGBTs, these contain parasitic thyristors which must be prevented from "latching up". Fortunately techniques which have been developed to suppress parasitic thyristors in devices such as insulated gate bipolar transistors, such as improving the emitter/base short within one of the two bipolar transistors within the parasitic thyristor by, for example, the zig-zag structure disclosed in "Electronic Engineering" April 1993, are suitable for use within this device.

Figure 3A:
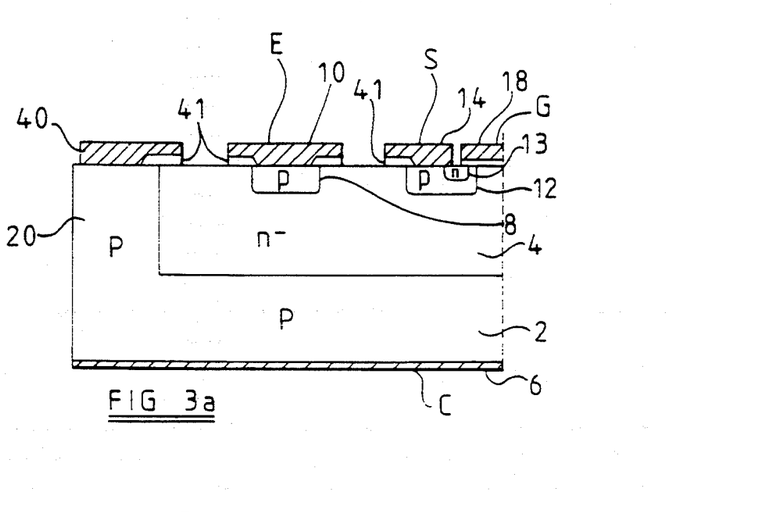
FIGS. 3a, 3b and 4 to 6 are diagrams of configurations for increasing the voltage rating of devices constituting embodiments of the present invention.
Figure 3B:
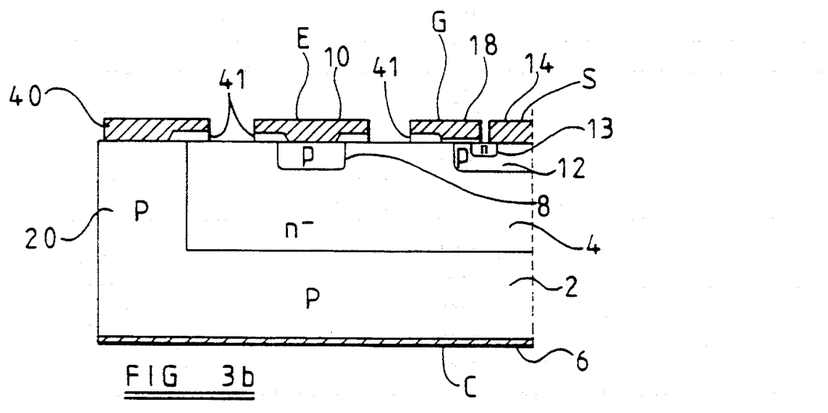
Figure 15A:
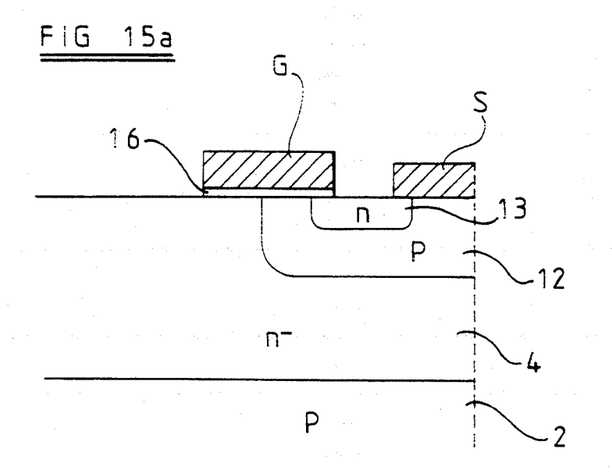
FIG. 15a is a schematic diagram of a lateral MOSFET which can be substituted in place of the vertical MOSFET, as shown in FIG. 15b, in any of the devices shown in FIGS. 4 to 12.

If the bipolar transistor within the structure is to be used in a saturated mode of operation, then the lateral MOSFET structure shown in FIGS. 1b, 3b and 15a is more suitable for driving the bipolar transistor. This is because the current in the lateral MOSFET is directed away from the parasitic vertical IGBT. Consequently less source current is required to obtain a given collector current.

In the non-conducting state, the applied voltage appears across the collector-base junction of the bipolar transistor. The depletion region is prevented from spreading to the side edge of the device by the provision of a further p type region 20 (FIGS. 1a and 1b) which connects the surface 9 with the substrate 2. The region 20 may be formed, for example, by a deep diffusion down from the surface 9 and/or up from an initially buried p⁺ region. The device would have a relatively leaky collector-base junction without the provision of the further p type region 20. The device is also capable of supporting a supplied voltage across the collector-source and emitter source junctions.

Techniques which are known to improve the voltage capability of a planar junction may advantageously be incorporated within an embodiment of the present invention. FIGS. 3a, 3b and 4 to 6 illustrate devices similar to that shown in FIGS. 1a and 1b. Like parts are labelled with the same reference numbers as used in FIGS. 1a and 1b and parts of the device have been omitted for the sake of clarity.

In the embodiment shown in FIG. 3a, a field plate 40 has been formed to cover the surface 9 at the junction between the p type region 20 and the n⁻ epitaxial layer 4. The field plate is a metallic conductor in electrical contact with the p type region 20 and in close proximity with, but insulated from, the epitaxial layer 4 by an insulating layer 41. The insulating layer 41 may, for example, be an oxide layer. Similarly the source and emitter contacts 14 and 10, respectively, may be laterally extended to over-hang the epitaxial layer 4, and be insulated therefrom, so as to form field plates. The or each field plate reduces the electric field intensity in the region of its associated junction. This in turn reduces the likelihood of breakdown and in turn allows the device to be rated for use with higher voltages.

A similar arrangement is shown in FIG. 3b. Here the gate and emitter contacts are laterally extended to overhang the epitaxial layer 4.

Figure 4:
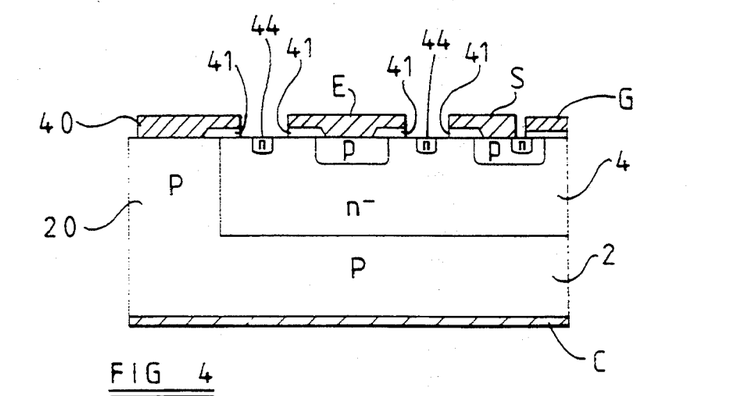

The device shown in FIG. 4 is similar to that shown in FIG. 3a. However, it possesses diffused rings 44 in the epitaxial layer 4 adjacent the surface 9. The rings 44 are formed of regions of n type semiconductor. The provision of the rings 44 also increases the voltage rating of the device.

Figure 5:
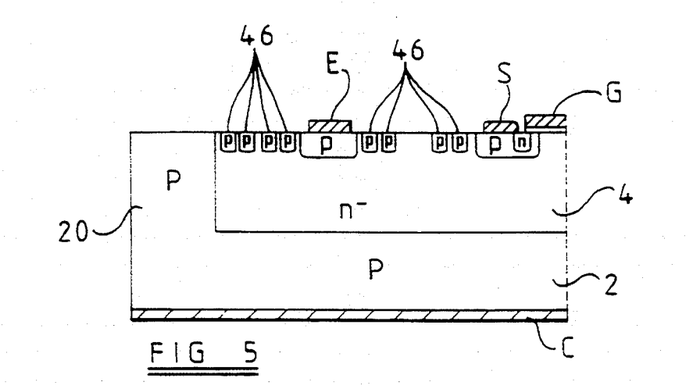
Figure 6:
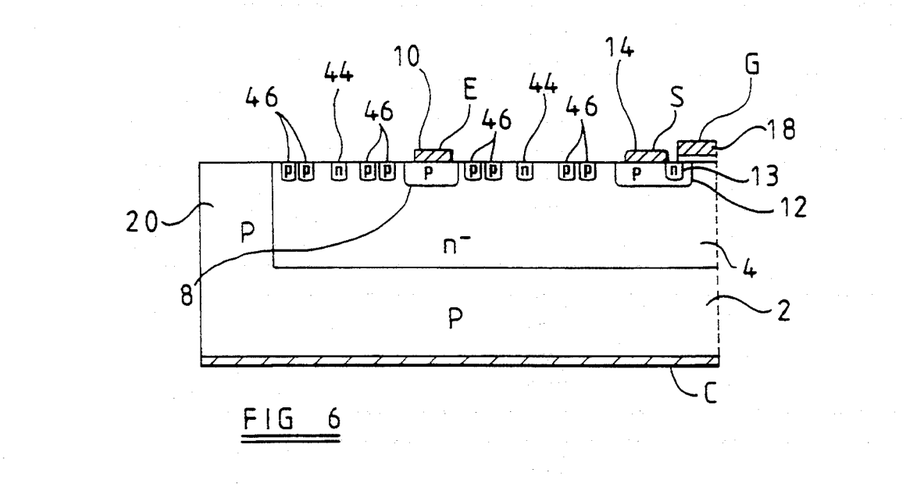

FIGS. 5 and 6 shows further embodiments in which the field plate is omitted and in which kao rings have been formed. In the embodiment illustrated in FIG. 5, the kao rings 46 are formed of p type semiconductor. The device illustrated in FIG. 6 has n type rings 44 interposed between pairs of p type kao rings 46. Field plates may also be provided.

Figure 7:
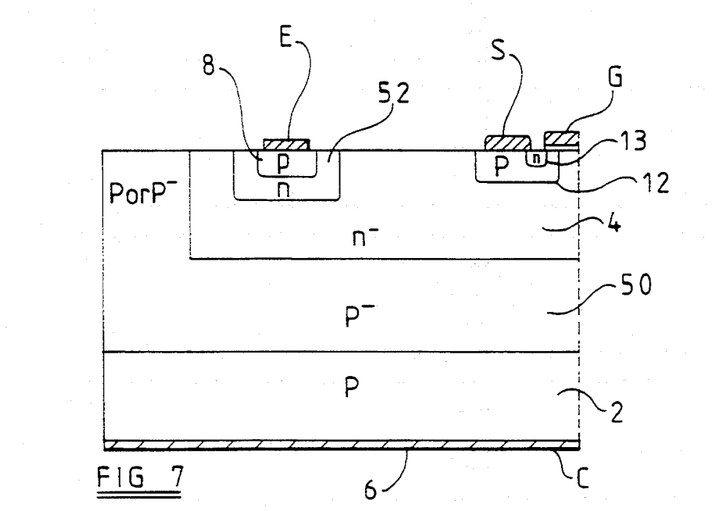
FIG. 7 is a diagram of a device constituting an embodiment of the present invention having regions to ensure that the bulk of the device breaks down before the collector-base depletion region reaches through to the emitter.

It is advantageous that, as the collector-base potential is increased, the device should breakdown in the bulk thereof before the depletion region across the collector-base junction reaches through to the emitter 8. Whilst this is not essential, it makes the characteristics of the device more predictable since, for example, the breakdown voltage is substantially independent of the gain of the bipolar transistor. This can be achieved by the inclusion within the collector region 2 of a less doped p⁻ region 50 and/or by increasing the doping in a region 52 of the base (i.e. the epitaxial layer 4) adjacent the emitter, as shown in FIG. 7.

In addition to the prior art method described to suppress the action of the parasitic IGBTs and thyristors, the lateral parasitic thyristor can be further suppressed by increasing the doping in the region 52 of the base which surrounds the emitter 8. This is because the increase in the dopant concentration reduces the gain of the p emitter, n⁻ epitaxial and p body bipolar component.

Figure 8:
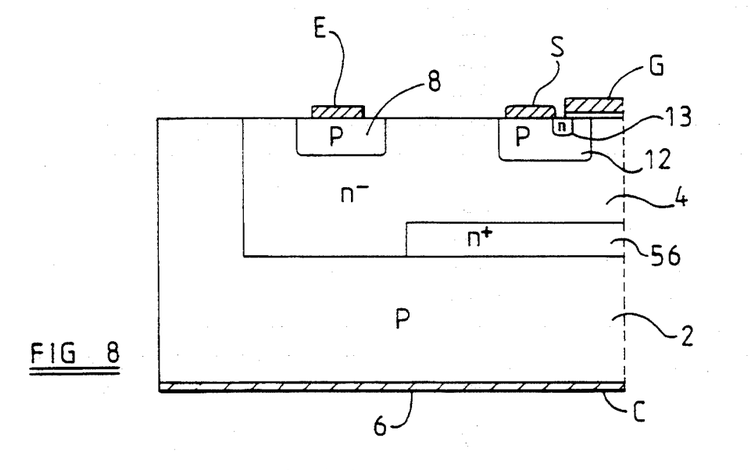
FIG. 8 is a diagram of a device having doping to reduce the effect of a parasitic thyristor and a parasitic IGBT.

The effect of the vertical parasitic thyristor can be reduced by including a heavily doped n+ region 56 at the collector-base interface under the DMOSFET, as shown in FIG. 8. Such doping reduces the gain of the collector, epitaxial, body bipolar component.

The techniques for suppressing the parasitic thyristors can be made more effective by the addition of "lifetime killers", such as gold and/or irradiation damage because these have a disproportionally large effect on reducing the gain of the poorer bipolar components within the parasitic thyristors compared with the intended PNP power bipolar transistor.

When the MOSFET is turned off, the base of the bipolar transistor becomes isolated and this can result in a relatively long turn off time, since the bipolar transistor continues to conduct until the minority carriers within the base have decayed. The use of "lifetime killers" as disclosed above, reduce the decay time and hence allow the device to turn nonconducting more quickly.

Figure 9:
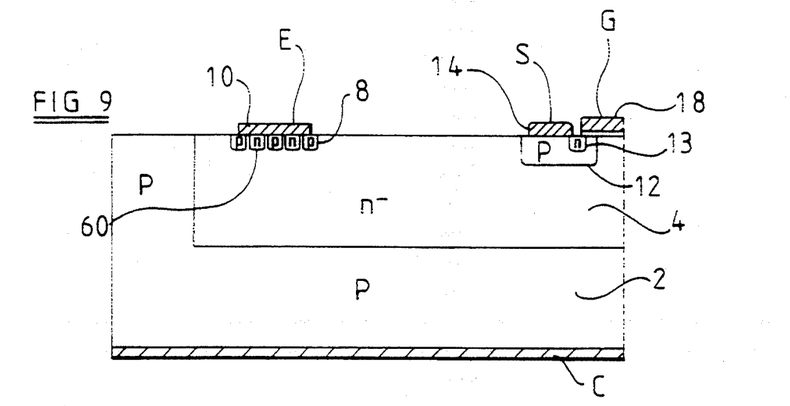
FIG. 9 is a diagram of a device having anode shorts within the emitter region thereof so as to decrease device turn off time.

A further way of reducing the turn off time of the device is to provide anode shorts to provide a path to conduct the carriers at turn off. Such an arrangement is shown in FIG. 9, where n type regions 60 are formed within the emitter region 8, so as to form a p-n-p-n-p structure beneath the emitter contact 10. Such an arrangement increases switching speed without the need to introduce lifetime killers.

Figure 10:
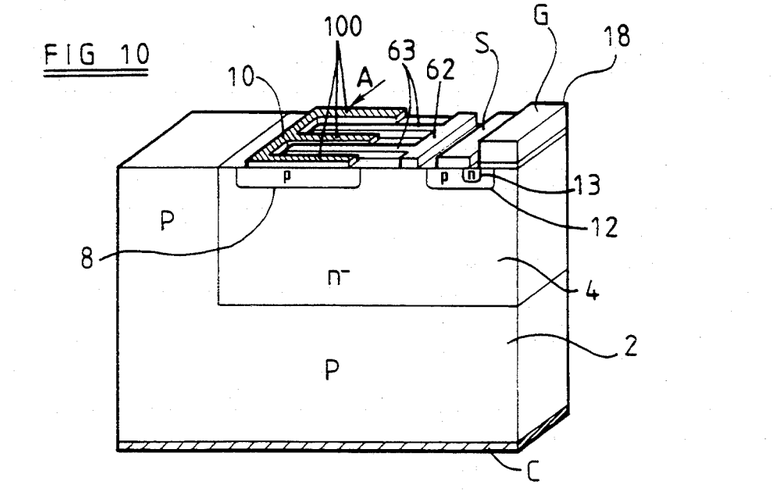
FIGS. 10 and 11 show devices having a conductor to improve base current distribution around the emitter region.
Figure 14:
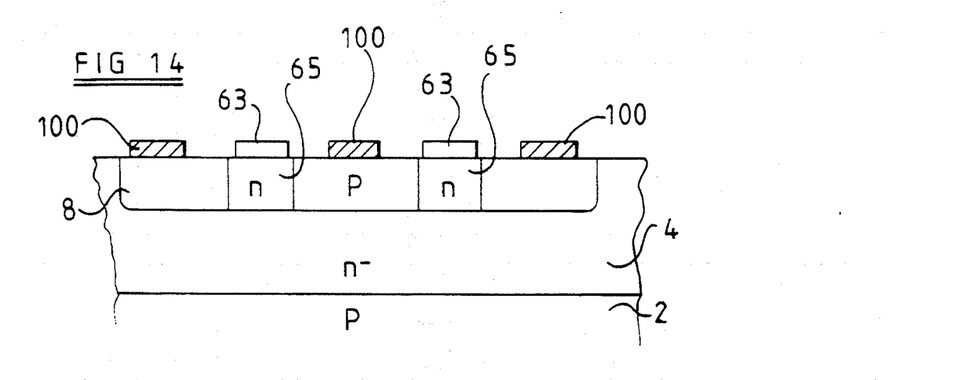
FIG. 14 is a cross-section of the emitter matrix structure of FIG. 10 along the direction of line A.

Improved performance can be obtained by using a metallic conductor 62 to distribute the base current more effectively throughout the emitter region 8, for example, the matrix structure disclosed in Electronic Engineering Times, 3rd Jun. 1991, is an efficient way of distributing the current, as shown in FIG. 10. The emitter region 8 is provided with an emitter contact 10 having a plurality of fingers 100. Similarly the metallic conductor 62 has a plurality of fingers 63 which are interdigitated with, but not touching, the fingers 100. The fingers 100 are in contact with the emitter region 8. The fingers 63 are insulated from the emitter region 8 by an oxide layer. However, there are regular breaks in the oxide layer. The breaks correspond to the positions of columns 65 of n type semiconductor which are within the emitter region 8, and which connect the fingers 63 with the epitaxial layer 4, as shown in FIG. 14, which is a cross-section through the emitter matrix along the direction of the arrow A in FIG. 10. Thus, the distribution of the base current throughout the emitter region is much improved, without sacrificing much emitter area.

Figure 11:
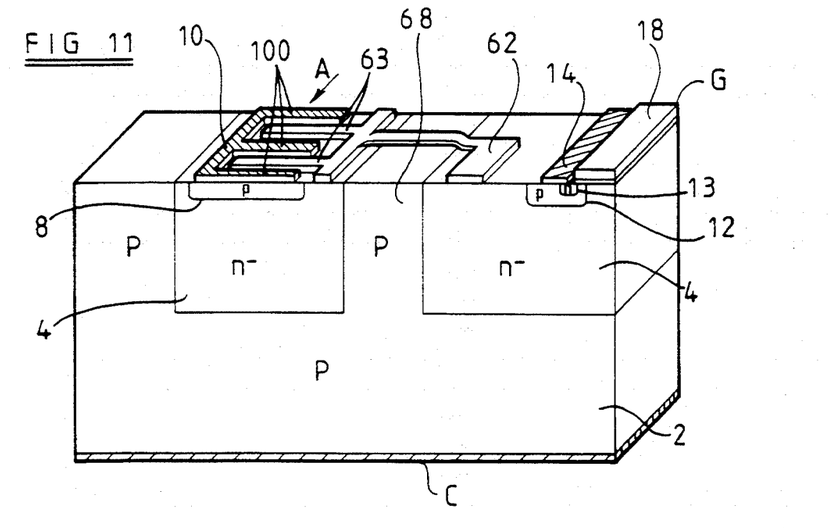

A further embodiment, in which the MOSFET and the bipolar transistor are isolated from each other by a p type region 68, is shown in FIG. 11. The only path between the transistors is provided by the metallic conductor 62, otherwise the structure of the emitter region is as described above with reference to FIGS. 10 and 14.

A gap can be provided between the conductor 62 and the further region 12, as shown in FIG. 11, so as to improve the break down voltage of the device. Such a gap can also be included in the embodiment shown in FIG. 10.

Figure 12:
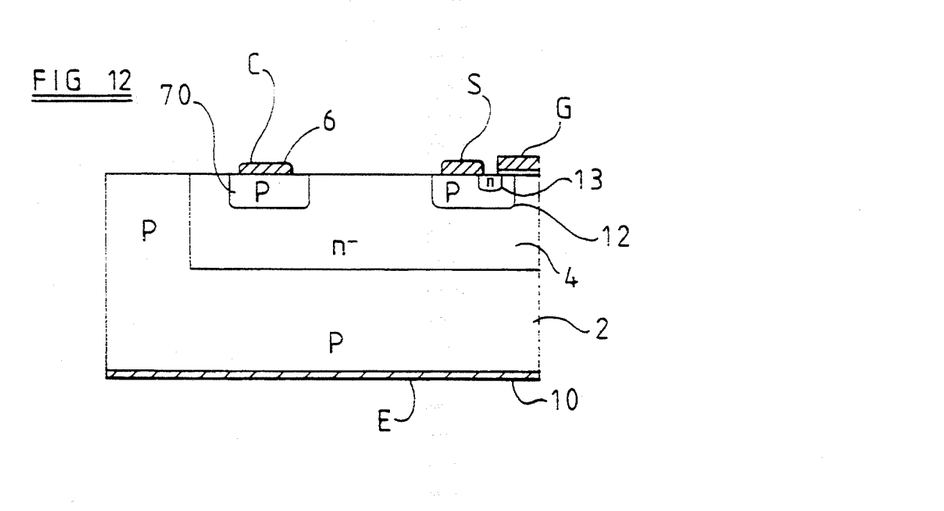
FIG. 12 is a schematic diagram of a device constituting an embodiment of the present invention and having an emitter formed by the substrate.
Figure 13:
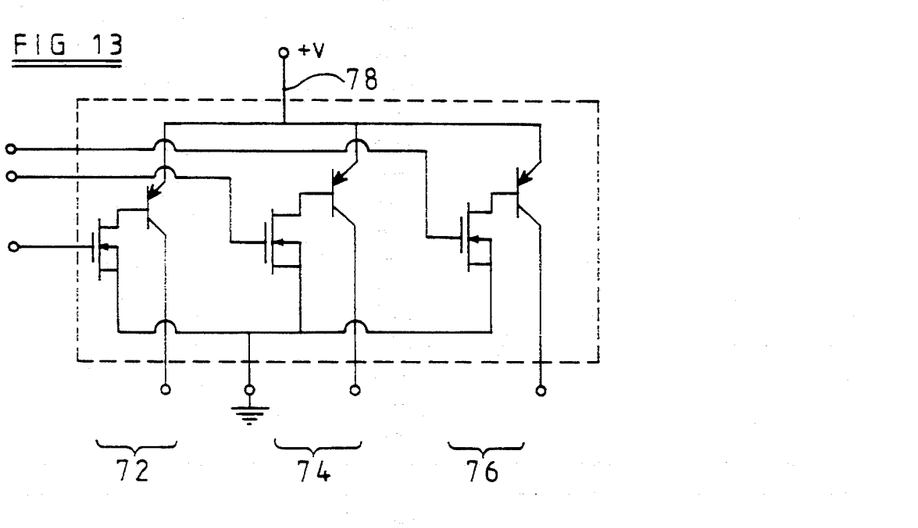
FIG. 13 is an equivalent circuit of three devices of the type shown in FIG. 12, having a common emitter.

As a further alternative, the substrate 2 may act as the emitter and a collector region may be formed by a p type region 70 within the epitaxial layer 4, as illustrated in FIG. 12. Thus, the collector and emitter terminals are effectively interchanged. This is less efficient, but the efficiency of this structure can be greatly enhanced by utilising the matrix structure. An advantage of interchanging the collector and emitter regions is that a common positive connection may be made to the substrate and a plurality of devices may be encapsulated within a single package or a plurality of die may be attached to a single contact. The connections made to the upper surface can be associated with individual devices and be connected to various loads which are independently connected to ground. This is particularly useful in common earth applications, such as in automotive systems. An equivalent circuit of a device is shown in FIG. 13. Three devices 72, 74 and 76 are encapsulated within a single package and share a common anode 78.

Figure 15B:
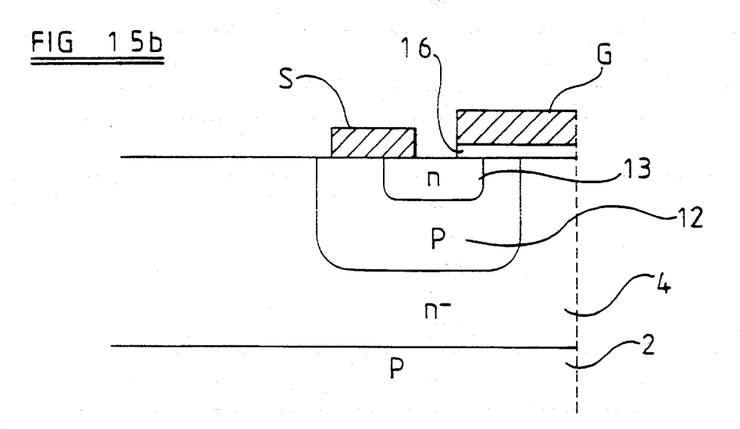

A lateral MOSFET, as shown in FIG. 15a, can be used in place of the vertical MOSFET, an example of which is shown in FIG. 15b, in any of the preceding embodiments described hereinbefore.

Protection diodes may be provided using known techniques to prevent static damage to the gate of the MOSFET.

It is thus possible to provide a power switching device having a low voltage drop in the conducting state and requiring very little drive power. The p type and n type regions may be interchanged so as to provide a device comprising an NPN bipolar transistor driven by a P channel MOSFET.

We claim:

1. A monolithically integrated semiconductor device, comprising:

first, second, third and gate terminals;

a vertically formed bipolar transistor output stage having a base region and a collector region and comprising a substrate comprising a first semiconductor, an epitaxial layer comprising a second semiconductor, and a first region comprising said first semiconductor; and at least one short channel metal oxide semiconductor field effect transistor comprising a second region of said first semiconductor and a third region of said second semiconductor;

said first terminal being connected to said substrate, said epitaxial layer being formed on said substrate, said first region being within said epitaxial layer and being connected to said second terminal, said second region being within said epitaxial layer, said third region being within said second region, said third terminal being connected to said second and third regions, and said gate terminal being adjacent sections of said second and third regions but substantially insulated therefrom and from said third terminal such that said at least one short channel metal oxide field effect transistor is arranged to control a current flow in said base region and is separate from said collector region.

2. A semiconductor device as claimed in claim 1, in which said at least one short channel metal oxide semiconductor field effect transistor is integrally formed within said base region.

3. A semiconductor device as claimed in claim 1, in which said at least one short channel metal oxide semiconductor field effect transistor has a short channel vertical DMOS structure.

4. A semiconductor device as claimed in claim 1, in which said at least one short channel metal oxide semiconductor field effect transistor has a short channel lateral DMOS structure.

5. A semiconductor device as claimed in claim 1, in which said at least one short channel metal oxide semiconductor field effect transistor has a gate terminal and a source terminal, said at least one short channel metal oxide semiconductor field effect transistor being arranged to operate in an enhancement mode so as to inhibit said current flow in said base when a potential at said gate terminal is less than a threshold voltage measured with respect to said source terminal.

6. A device as claimed in claim 1, in which said first semiconductor is a P type semiconductor, said second semiconductor is an N type semiconductor, said first terminal is a collector, said second terminal is an emitter, said third terminal is a source, and said substrate is said collector region.

7. A device as claimed in claim 1, in which said first semiconductor is a P type semiconductor, said second semiconductor is an N type semiconductor, said first terminal is an emitter, said second terminal is a collector, said third terminal is a source, and said first region is said collector region.

8. A device as claimed in claim 1, further comprising a metallic conductor extending from part of said epitaxial layer adjacent said second region to regions of said second semiconductor formed within said first region, said metallic conductor being arranged to distribute a base current around said first region.

9. A device as claimed in claim 1, further comprising a metallic conductor extending from part of said epitaxial layer adjacent said second region to a further part of said epitaxial layer adjacent said first region, said metallic conductor being arranged to distribute a base current around said first region.

10. A device as claimed in claim 1, in which said device is formed in a die comprising a substrate of a first semiconductor, and a fourth region comprising said first semiconductor, said die having edges and a surface, and said fourth region extending, at the edges of said die, from said substrate to said surface.

11. A device as claimed in claim 1, further comprising at least one field plate.

12. A device as claimed in claim 1, further comprising Kao rings within said epitaxial layer.

13. A device as claimed in claim 1, further comprising a fifth region of semiconductor intermediate said substrate and said epitaxial layer, said fifth region having a lower doping concentration than said substrate.

14. A device as claimed in claim 1, having a sixth region of semiconductor intermediate said epitaxial layer and said first region of semiconductor, said sixth region being more heavily doped than said epitaxial layer.

15. A device as claimed in claim 1, further comprising a heavily doped region of said epitaxial layer at an interface between said epitaxial layer and said substrate beneath said at least one short channel metal oxide semiconductor field effect transistor.

16. A device as claimed in claim 1, further comprising anode shorts adjacent said second terminal.

17. A monolithically integrated semiconductor device, comprising a bipolar transistor output stage having a base region and a collector region, and at least one short channel lateral DMOS field effect transistor, said at least one short channel lateral DMOS field effect transistor being arranged to control a current flow in said base region and being separate from said collector region.

* * * * *

UNITED STATES PATENT AND TRADEMARK OFFICE
CERTIFICATE OF CORRECTION

PATENT NO. : 5,440,164
DATED : August 8, 1995
INVENTOR(S) : Adrian D. Finney et al.

It is certified that error appears in the above-indentified patent and that said Letters Patent is hereby corrected as shown below:

On the title page, left column at [73], "Zetek plc,"

should read --Zetex plc,"

Signed and Sealed this

Twelfth Day of December, 1995

Attest:

BRUCE LEHMAN

Attesting Officer

Commissioner of Patents and Trademarks